United States Patent
Choi et al.

(10) Patent No.: US 7,594,157 B2
(45) Date of Patent: Sep. 22, 2009

(54) MEMORY SYSTEM WITH BACKUP CIRCUIT AND PROGRAMMING METHOD

(75) Inventors: Jin-Hyeok Choi, Yongin-si (KR); Bong-Ryeol Lee, Seoch-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 267 days.

(21) Appl. No.: 11/724,266

(22) Filed: Mar. 15, 2007

(65) Prior Publication Data

US 2008/0162789 A1 Jul. 3, 2008

(30) Foreign Application Priority Data

Jan. 3, 2007 (KR) ...................... 10-2007-0000737

(51) Int. Cl.
- G11C 29/00 (2006.01)
- G11C 16/06 (2006.01)
- G06F 12/00 (2006.01)

(52) U.S. Cl. .................. 714/764; 365/185.09; 711/103
(58) Field of Classification Search ................. 714/718, 714/723, 763
See application file for complete search history.

(56) References Cited

U.S. PATENT DOCUMENTS

| | | | |
|---|---|---|---|
| 5,867,417 A | 2/1999 | Wallace et al. | |
| 6,011,741 A | 1/2000 | Wallace et al. | |
| 6,031,758 A | 2/2000 | Katayama et al. | |
| 6,130,837 A | 10/2000 | Yamagami et al. | |
| 6,304,485 B1 | 10/2001 | Harari et al. | |
| 6,327,639 B1 * | 12/2001 | Asnaashari | 711/103 |
| 6,347,051 B2 | 2/2002 | Yamagami et al. | |
| 6,373,747 B1 | 4/2002 | Harari et al. | |
| 6,625,061 B2 * | 9/2003 | Higuchi | 365/185.09 |
| 7,096,406 B2 * | 8/2006 | Kanazawa et al. | 714/763 |
| 7,290,082 B2 * | 10/2007 | Kwon | 711/103 |
| 7,295,479 B2 * | 11/2007 | Yoon et al. | 365/200 |
| 7,478,292 B2 * | 1/2009 | Visconti | 714/721 |
| 2005/0286336 A1 * | 12/2005 | Harari et al. | 365/232 |

FOREIGN PATENT DOCUMENTS

| | | |
|---|---|---|
| JP | 2000298992 | 10/2000 |
| JP | 2001210082 | 8/2001 |
| JP | 2003233998 | 8/2003 |
| KR | 1020050094569 A | 9/2005 |

* cited by examiner

Primary Examiner—James C Kerveros
(74) Attorney, Agent, or Firm—Volentine & Whitt, PLLC (57) ABSTRACT

Provided are a memory system and a program method. The memory system includes a flash memory and a memory controller. The flash memory stores first bit data and then stores second bit data in a multi-level memory cell. The memory controller includes a buffer memory temporarily storing the first bit data and the second bit data, and a backup memory storing the first bit data while the flash memory is storing the second bit data. The backup memory re-programs the first bit data to the flash memory upon detecting a program failure associated with the storing the second bit data.

18 Claims, 11 Drawing Sheets

(PRIOR ART)

MEMORY SYSTEM WITH BACKUP CIRCUIT AND PROGRAMMING METHOD

BACKGROUND OF THE INVENTION

1. Field of the Invention

The present invention relates to memory systems, and more particularly, to a memory system capable of programming multi-bit data. The invention also relates to programming methods for such memory systems.

This U.S. non-provisional patent application claims priority under 35 U.S.C. § 119 to Korean Patent Application No. 10-2007-0000737, filed on Jan. 3, 2007, the subject matter of which is hereby incorporated by reference.

2. Discussion of Related Art

An increasing number of consumer products use nonvolatile memory to store data. Examples of contemporary consumer products incorporating nonvolatile memory include MP3 players, digital cameras, mobile phones, camcorders, flash cards, and solid-state disks (SSDs).

As the variety and sophistication of these consumer products increases, nonvolatile memory is expected to store an increasing quantity of data and to access this data at faster speeds. One approach to increasing the overall data storage capacity of nonvolatile memory is the use of the multi-level cell (MLC). In contrast to conventional single-level cells (SLC), multi-level memory cells are able to store more than one data bit per cell.

Figure 1:
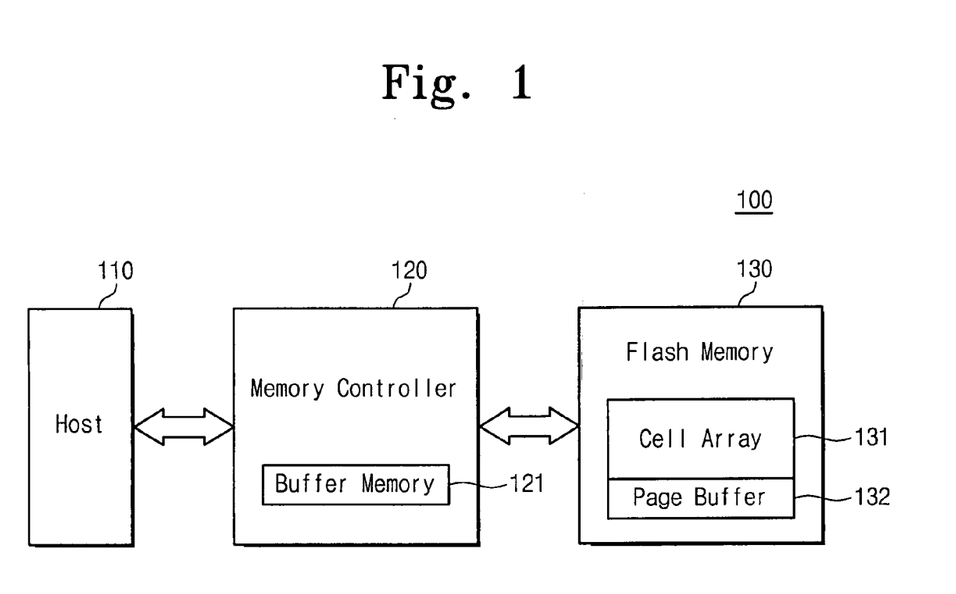
FIG. 1 is a block diagram of a conventional memory system.

Figure (FIG.) 1 is a general block diagram of a conventional memory system. The conventional memory system 100 includes a host processor (e.g., a CPU) 110, a memory controller 120, and flash memory 130.

Memory controller 120 includes a buffer memory 121. Flash memory 130 includes a cell array 131 and a page buffer 132. Although not illustrated in FIG. 1, flash memory 130 also includes a decoder, a data buffer, and a control unit.

Memory controller 120 receives data and a corresponding write command from host 110 and controls flash memory 130, such that the data is written in cell array 131. Alternately, memory controller 120 receives a read command from host 110 and controls flash memory 130, such that data indicated by the read command is read from cell array 131.

Buffer memory 121 is used within memory controller 120 to temporarily store "write data" to be written to flash memory 130 or "read data" retrieved from flash memory 130. Under the control of memory controller 120, buffer memory 121 transfers this temporarily-stored read/write data to host 110 or flash memory 130.

Cell array 131 of flash memory 130 includes a plurality of memory cells arranged in an array. The memory cells are nonvolatile and are therefore able to retain stored data even in the absence of applied power. Page buffer 132 stores write data to be written to a selected page in cell array 131 or read data retrieved from a selected page.

The constituent memory cells of flash memory 130 may be single-level cells or multi-level cells. An example of flash memory 130 will first be described under an assumption that single-level memory cells are used.

A SLC has two possible data states (1 or 0) depending on threshold voltage distributions. A SLC storing a logical value of "1" is in an erase state. A SLC storing a logical value of "0" is in a program state. The erase-state memory cell is referred to as an ON cell, and the program-state memory cell is referred to as an OFF cell.

Flash memory 130 performs a program operation on a page-by-page basis. During the program operation, memory controller 120 transfers write data to flash memory 130 on a page-by-page basis through buffer memory 121.

Page buffer 132 temporarily stores the write data received from buffer memory 121, and then programs the loaded write data into a selected memory page. Upon completion of the program operation, a program verifying operation is performed to verify that the data has been correctly programmed.

If a program failure occurs, the program operation and corresponding program verifying operation are again performed after increasing the voltage used to program the selected page. In this way, a program operation for a given page of write data may be successfully completed. Thereafter, a next batch of write data is received and the program operation is repeated.

Figure 2:
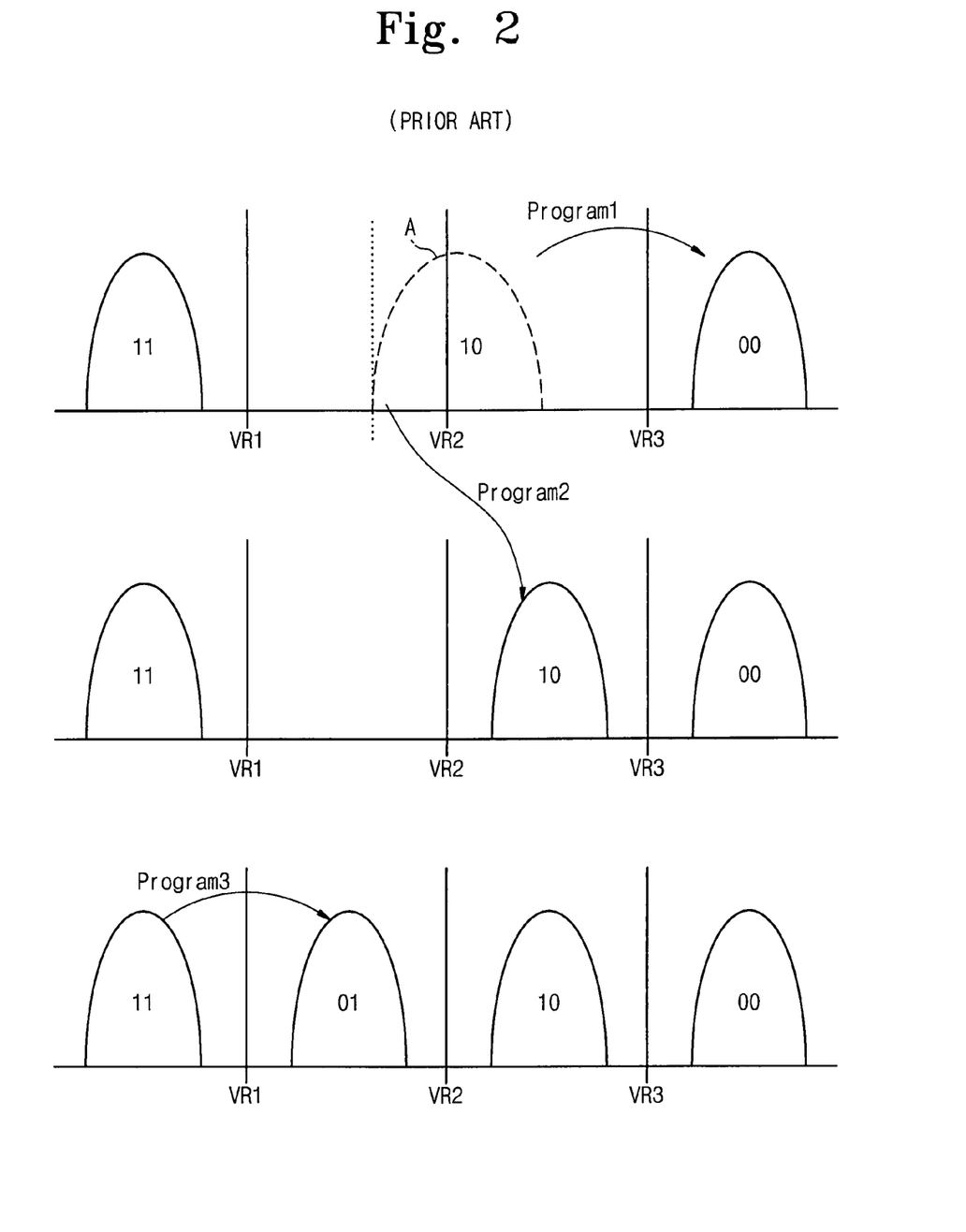
FIG. 2 is a diagram illustrating a process of programming multi-bit data in a memory cell.

A second description of the operation of flash memory 130 will now be given under the assumption that multi-level cells are used. FIG. 2 is a voltage threshold diagram illustrating a process of programming the least significant bit (LSB) and the most significant bit (MSB) of a 2-bit MLC. Two bit multi-level memory cells are used in the following descriptions, but the invention is not limited to only 2-bit memory cells. Within this context, LSB and MSB designations are clear. Alternately stated, however, any "first bit" and "second bit" arrangement might be used beyond the MSB and LSB relationship apparent in a 2-bit memory cell.

Referring to FIG. 2, a MLC is programmed to have one of four states 11, 01, 10 and 00 according its threshold voltage distribution. The LSB is programmed in a process similar to that of the SLC. A memory cell with a state 11 is programmed to have a state A (indicated by a dashed line) according to its LSB of data.

Thereafter, memory controller 120 transfers a page of write data from buffer memory 121 to flash memory 130 in order to program the MSB. Referring to FIG. 2, a MLC having state A is programmed to have a state 00 or a state 10 according to its MSB of data. On the other hand, a memory cell having a state 11 is programmed to either maintain the state 11 or to have a state 01 according to its MSB of data.

Thus, the program operation for a MLC proceeds in two distinct stages. That is, the LSB is first programmed in the MLC and then the MSB is programmed.

However, a program failure may occur during the programming of the MSB independent of the previously performed LSB programming operation. Fortunately, damaged MSB data may be repaired because "current" MSB data is retained in buffer memory 121 until completion of a corresponding, program verifying operation.

Unfortunately, experience has shown that MSB programming errors frequently change previously-programmed LSB data. However, damaged LSB data cannot be repaired as simply as damaged MSB data, since the (earlier stage) LSB data is no longer stored in buffer memory 121. Therefore, conventional flash memory systems incorporating multi-level cells are prone to the loss of LSB data.

SUMMARY OF THE INVENTION

Embodiments of the invention provide a memory system capable of preventing the loss of LSB data during a multi-bit data program operation. Embodiments of the invention also provide a program method for a memory system incorporating multi-level cells which prevents loss of LSB data.

In one embodiment, the invention provides a memory system comprising; a flash memory sequentially storing first bit data and second bit data, and a memory controller including a buffer memory temporarily storing the first bit data and the second bit data, and a backup memory storing the first bit data during an operation associated with storing the second bit data, wherein the backup memory re-programs the first bit data to the flash memory upon detecting failure of the operation associated with storing the second bit data.

In another embodiment, the invention provides a memory system comprising; a host communicating original data and a command, a flash memory comprising a page buffer and adapted to sequentially store first bit data and second bit data associated with original data in an array of multi-level memory cells, and a memory controller responsive to the command and comprising; a buffer memory temporarily storing the first bit data and the second bit data and transferring the first bit data and the second bit data to and from the page buffer, a comparator comparing the second bit data actually stored in the flash memory with second bit data stored in the buffer memory following a program associated with storing the second bit data, and generating a comparison result, a fail position detector responsive to the comparison result and generating fail position information, an ECC circuit performing first order repair on errant first bit data following the operation associated with storing the second bit data, and a repair circuit performing second order repair on the errant first bit data in relation to the fail position information, and a backup memory storing the first bit data during the operation associated with storing the second bit data.

In another embodiment, the invention provides a program method for a memory system including a flash memory storing original data and a related memory controller, the method comprising; transferring first and second bit data associated with the original data to a buffer memory in the memory controller, programming the first bit data in the flash memory, storing the first bit data in a backup memory while programming the second bit data in the flash memory, and re-programming the first bit data in the flash memory upon detecting a failure associated with the programming of the second bit data by reading the stored first bit data from the backup memory.

In another embodiment, the invention provides a program method for a memory system including a flash memory storing original data and a related memory controller, the method comprising; transferring first and second bit data associated with the original data to a buffer memory in the memory controller, programming the first bit data in the flash memory, storing the first bit data in a backup memory while programming the second bit data in the flash memory, following detection of a failure associated with the programming of the second bit data in flash memory, correcting the first bit data stored in flash memory using an error correction coding scheme, comparing actually stored second bit data with the second bit data associated with the original data, and repairing first bit data in response to the comparison.

DESCRIPTION OF EMBODIMENTS

Embodiments of the present invention will be described with reference to the accompanying drawings. The present invention may, however, may be embodied in many different forms and should not be constructed as being limited to only the illustrated embodiments. Rather, these embodiments are presented as teaching examples. Throughout the specification, it should be noted that the terms "write" and "program" have essentially the same meaning.

Figure 3:
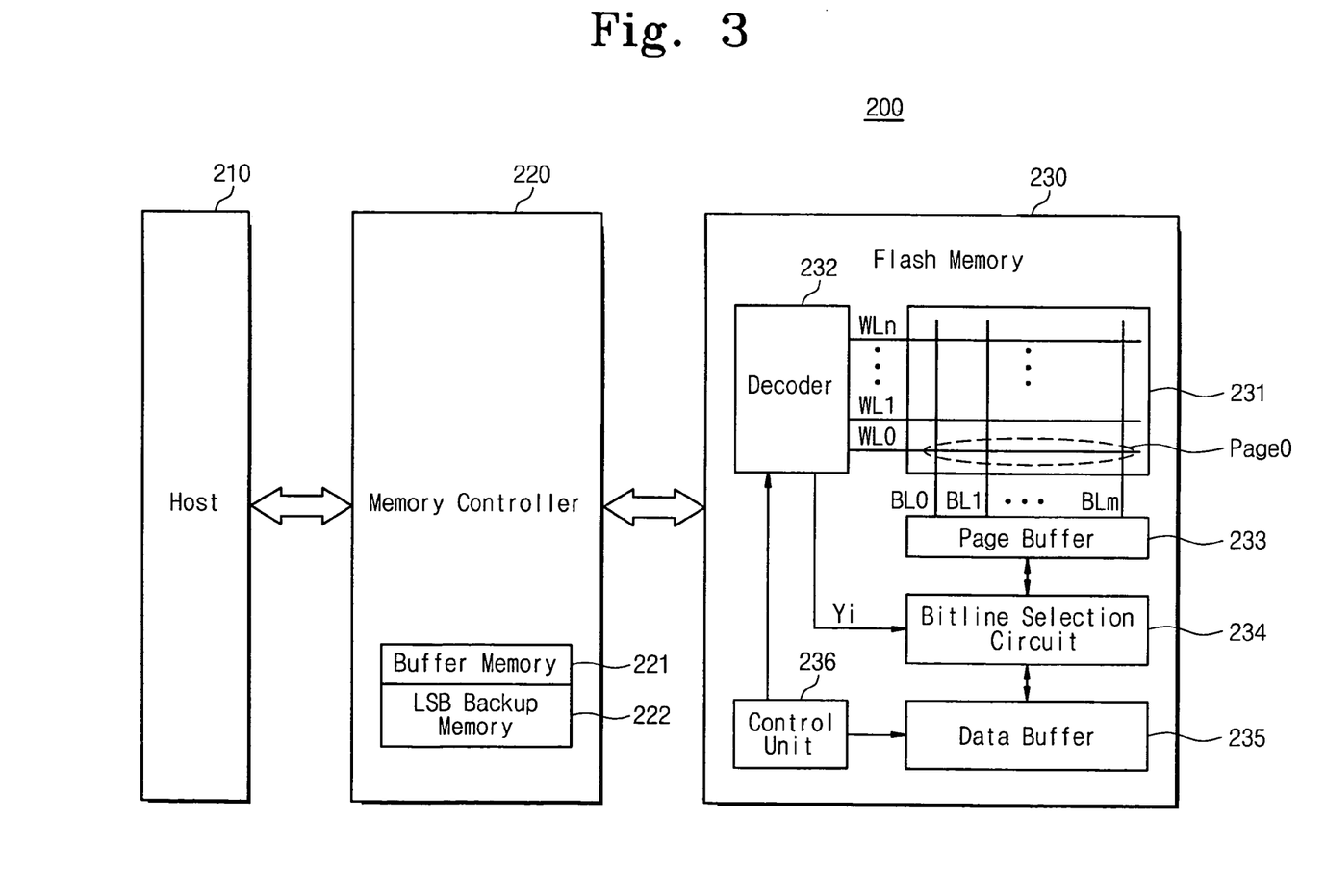
FIG. 3 is a block diagram of a memory system according to a first embodiment of the present invention.

FIG. 3 is a block diagram of a memory system according to an embodiment of the invention.

Referring to FIG. 3, a memory system 200 includes a host (or various host components, such as a CPU) 210, a memory controller 220, and a flash memory 230. Flash memory 230 includes multi-level cells adapted to store multi-bit data. In the illustrated example, memory system 200 is assumed to program a Least Significant Bit (LSB) of data followed by a Most Significant Bit (MSB) of data.

Despite the simple illustration shown in FIG. 3, memory controller 220 and flash memory 230 may be variously implemented. For example, these components may be commonly provided on a memory card, such as a multi-media card (MMC), SD card, XD card, CF card, and SIM card. As implemented on a memory card, memory controller 220 and flash memory 230 may be connected to host 210 (e.g., a digital camera, portable phone, MP3 player, or PMP) using conventional interface hardware and protocols.

However physically implemented, memory controller 220 receives one or more commands from host 210 and in response controls the overall operation (including write and read operations) of flash memory 230. Memory controller 220 includes a buffer memory 221 and an LSB backup memory 222.

Buffer memory 221 is used to temporarily store "write data" to be written in flash memory 230 and "read data" retrieved from flash memory 230. The read/write data stored in buffer memory 221 is transferred to flash memory 230 or host 210 under the control of memory controller 220. Buffer memory 221 may be implemented using a random access memory (RAM) such as a static RAM (SRAM) and a dynamic RAM (DRAM).

LSB backup memory 222 in memory controller 220 is used in conjunction with the program of multi-bit write data to flash memory 230.

It is assumed in this example that multi-level data is programmed to flash memory 230 by first programming the LSB and thereafter programming the MSB. As noted above, this approach to programming multi-bit data allow for the possibility that the previously programmed LSB may be damaged (i.e., altered in its threshold voltage) during the programming of the MSB in flash memory 230. That is, when a MSB program failure occurs, the previously-programmed LSB may be lost. In order to prevent this problem, LSB backup memory 222 is used to backup the LSB data written to flash memory 230 immediately preceding the programming of the MSB.

Like buffer memory 221, LSB backup memory 222 may be implemented using an RAM. Although buffer memory 221 and LSB backup memory 222 are illustrated as being separately implemented, they may be commonly provided in a single memory. That is, a single RAM may be used (i.e., partitioned in its access and storage functions) to implement a buffer area for temporarily storing read/write data, as well as backing up current LSB data.

Flash memory 230 includes a cell array 231, a decoder 232, a page buffer 233, a bitline selection circuit 234, a data buffer 235, and a control unit 236. In FIG. 3, a NAND flash memory is assumed in the example.

Cell array 231 includes a plurality of memory blocks (not illustrated). Each of the memory blocks includes a plurality of pages (e.g., 32 pages and 64 pages), and each of the pages includes a plurality of memory cells (e.g., 512 bytes, 2K bytes) that share a wordline WL. In the case of a NAND flash memory, an erase operation is performed on a block-by-block basis and read/write operations are performed on a page-by-page basis.

Each of the memory cells in the illustrated example is assumed to store multi-bit data (e.g., 2 bits). Thus, each memory cell may be programmed in one of four possible states in accordance with defined threshold voltage distributions. Referring to FIG. 2, after completion of a program operation, each memory cell may have one of states 11, 01, 10 and 00. In this case, the LSB and the MSB are (1, 1, 0, 0) and (1, 0, 1, 0), respectively.

Decoder 232 is connected through wordlines WL0~WLn to cell array 231, and is controlled by control unit 236. Decoder 232 receives an address ADDR from memory controller 220 and generates a select signal Yi to select a wordline (e.g., WL0) or a bitline BL. Page buffer 233 is connected through bitlines BL0~BLm to cell array 231.

During a write operation, page buffer 233 stores write data loaded from buffer memory 221. A page of write data is loaded into page buffer 233 at each write operation. The loaded write data is collectively programmed to a selected page (e.g., page 0 in the illustrated example) during a program operation.

During a read operation, page buffer 233 receives read data from a selected page and temporarily stores it. In response to a read enable signal nRE (not illustrated), the read data stored in page buffer 233 is transferred to buffer memory 221 or to LSB backup memory 222.

Bitline selection circuit 234 is used to select a bitline in response to the select signal Yi. Data buffer 235 is an I/O buffer that is used to transfer data between memory controller 220 and flash memory 230. Control unit 236 receives control signal(s) from memory controller 220 and in response controls the internal operation of flash memory 230.

In embodiments of the invention, such as the one illustrated in FIG. 3, the memory system includes a LSB backup memory within the memory controller. Thus, embodiments of the invention preferably store LSB data in LSB backup memory 222 prior to programming of the MSB data that corresponds with the stored LSB data. Thereafter, MSB data is programmed. If the MSB is successfully (e.g., correctly) programmed in cell array 231, the LSB data stored in LSB backup memory 222 may be erased.

On the other hand, if the MSB is unsuccessfully programmed in cell array 231 and the LSB previously stored in cell array 231 is damaged in the process, the memory block including the memory cell associated with the program failure is subsequently treated as a bad block. Thereafter, the LSB data stored in LSB backup memory 222 is programmed to another memory block, and the corresponding MSB stored in buffer memory 221 is then programmed. Accordingly, the potential loss of LSB data during the multi-level data program operation may be prevented.

Figure 4:
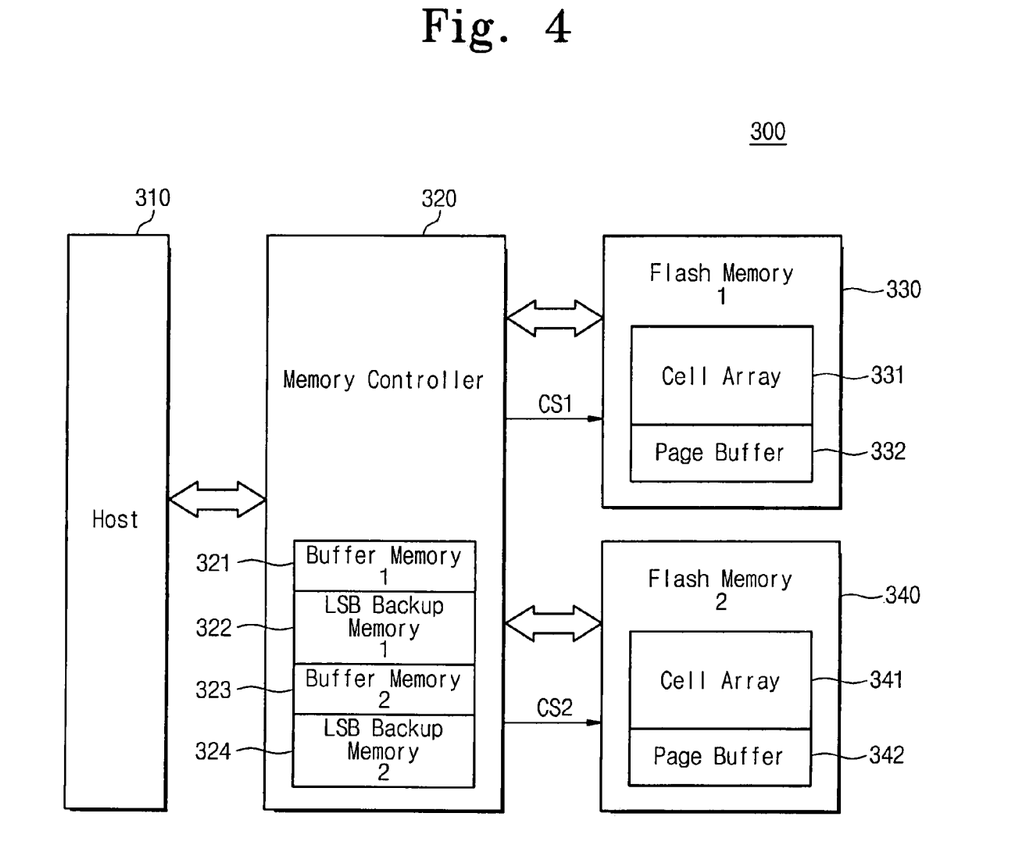
FIG. 4 is a block diagram of a memory system according to a second embodiment of the present invention.

FIG. 4 is a block diagram of a memory system according to another embodiment of the invention.

Referring to FIG. 4, a memory system 300 includes a host 310, a memory controller 320, a first flash memory 330, and a second flash memory 340. Like flash memory 230 in FIG. 3, first flash memory 330 and second flash memory 340 can store multi-bit data in a memory cell. In addition, memory controller 320, first flash memory 330, and second flash memory 340 may be integrated into a memory card.

Memory controller 320 receives one or more command(s) from host 310, and controls the overall operation of first flash memory 330 and second flash memory 340 according to the received command(s). Memory controller 320 generates a first chip select signal CS1 and a second chip select signal CS2. The first chip select signal CS1 is used to select first flash memory 330, and the second chip select signal CS2 is used to select second flash memory 340.

Memory controller 320 includes a first buffer memory 321, a second buffer memory 323, a first LSB backup memory 322, and a second LSB backup memory 324. First buffer memory 321 and first LSB backup memory 322 are used for write/read operations associated with first flash memory 330. Likewise, second buffer memory 323 and second LSB backup memory 324 are for write/read operations associated with second flash memory 340.

First flash memory 330 and second flash memory 340 are selected by the first chip select signal CS1 and the second chip select signal CS2, respectively. First flash memory 330 includes a cell array 331 and a page buffer 332. Likewise, second flash memory 340 includes a cell array 341 and a page buffer 342. The internal structures and operations of first and second flash memories 330 and 340 are the same as those described above in relation to FIG. 3.

A description will now be given of a write operation directed to the programming of multi-bit data in cell arrays 331 and 341 of first and second flash memories 330 and 340. The following description assumes for purposes of illustration that a program operation associated with second flash memory 340 is performed after a program operation associated with first flash memory 330.

First, first flash memory 330 is enabled by the first chip select signal CS1. The LSB data is written to a selected page (hereinafter referred to as page 2) of first flash memory 330. Before writing the MSB data to first flash memory 330, memory controller 320 reads the LSB data from page 2 and stores it in first LSB backup memory 322. Thereafter, using page buffer 332, memory controller 320 programs the MSB data in the first buffer memory 321 to page 2.

Thereafter, memory controller 320 verifies that the MSB data has been successfully programmed in page 2. If a program failure occurs, that is, if the MSB data has been unsuccessfully programmed, the MSB program operation (and its corresponding program verifying operation) are repeated, as needed using an increasing program voltage. Once write data intended for page 2 has been successfully programmed (and verified), memory controller 320 erases the LSB data stored in first LSB backup memory 322.

On the other hand, if repeated attempts to program the write data fail, memory controller 320 identifies the current memory block including a memory cell associated with the program failures as a bad block. Thereafter, memory controller 320 programs the LSB data stored in first LSB backup memory 322 to another selected page (hereinafter referred to as page 3) in another memory block. Thereafter, memory controller 320 programs the MSB stored in first buffer memory 321 to page 3.

When the second chip select signal CS2 is generated, second flash memory 340 is enabled. At this point, multi-bit data is programmed to second flash memory 340. The program operation of second flash memory 340 is similar to that of first flash memory 330.

Second buffer memory 323 and second LSB backup memory 324 are used to program multi-bit data to second flash memory 340. Second buffer memory 323 performs the same function as first buffer memory 321, and second LSB backup memory 324 performs the same function as first LSB backup memory 322 in this regard.

Despite the conceptual illustration of FIG. 4, first buffer memory 321, second buffer memory 323, first LSB backup memory 322, and second backup memory 324 may be implemented using a common memory or memory sub-system. For example, the foregoing memories (321 through 324) may be implemented using a single RAM partitioned and controlled to implement four (4) separate memory areas.

Because the LSB must be always read and backed up before the MSB program operation, memory systems 200 and 300 of FIGS. 3 and 4 require a significantly long programming time in order to program multi-bit data. For certain applications, this extended programming period may degrade overall performance of the memory system.

In addition, memory controllers 220 and 320 of memory systems 200 and 300 must include one or more LSB backup memories. In particular, when a single memory controller is used to control a plurality of flash memories, it must include and account for a plurality of backup memories, each backing up LSB data for a respective flash memory. For example, memory controller 320 of memory system 300 has twice as many LSB backup memories as memory controller 220 of memory system 200.

Memory systems according to the following additional embodiments of the invention address these issues of overall programming speed and expanding LSB backup memories.

Figure 5:
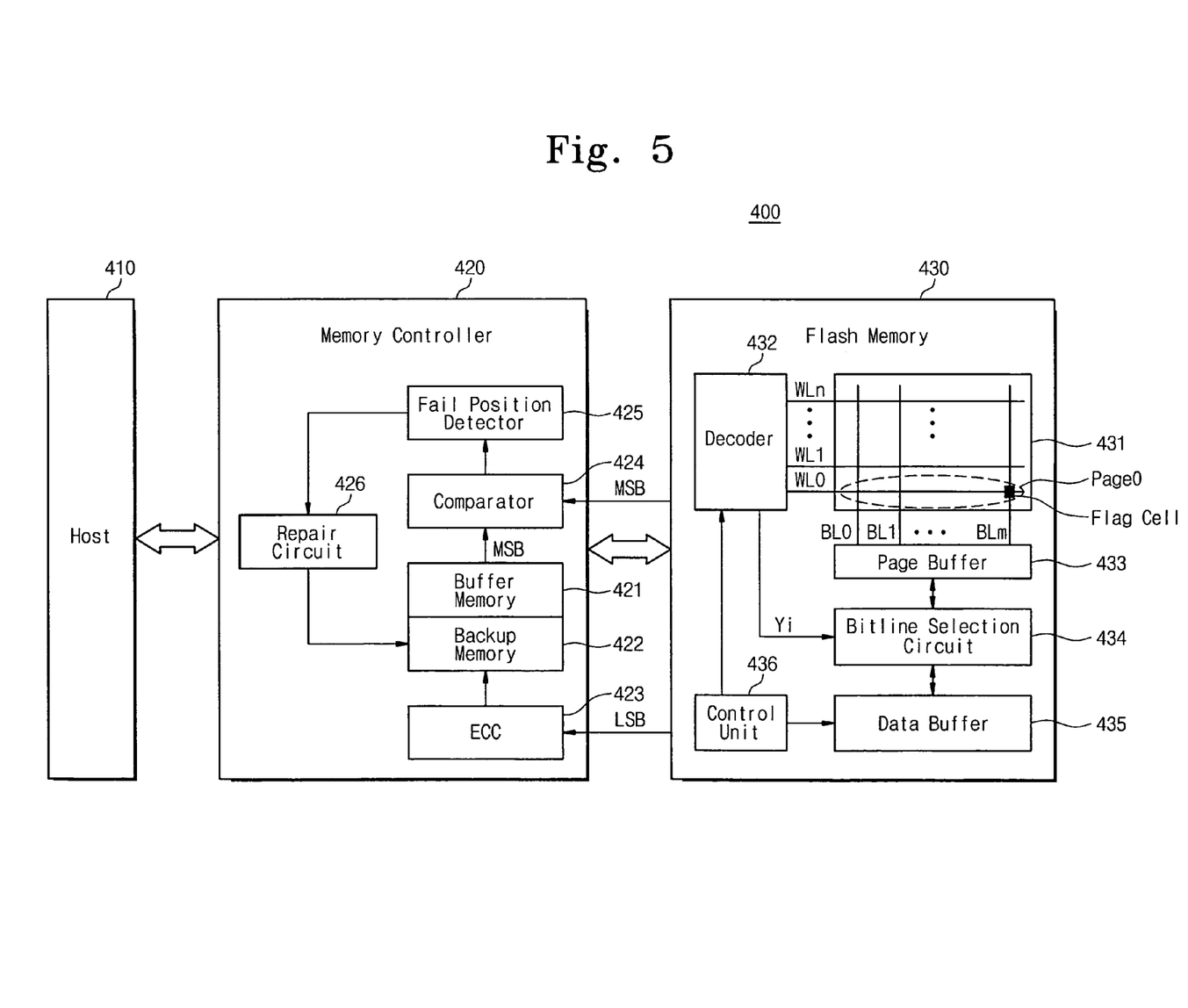
FIG. 5 is a block diagram of a memory system according to a third embodiment of the present invention.

For example, FIG. 5 is a block diagram of a memory system according to anther embodiment of the invention.

Referring to FIG. 5, a memory system 400 includes a host 410, a memory controller 420, and a flash memory 430. As before, memory controller 420 and flash memory 430 may be implemented on a memory card.

Memory controller 420 receives one or more commands from host 410 and in response controls the overall operation (including write/read operations) of flash memory 430. Memory controller 420 includes a buffer memory 421, a backup memory 422, an error correction code (ECC) circuit 423, a comparator 424, a fail position detector 425, and a repair circuit 426.

Buffer memory 421 is used to temporarily store write data to be written to flash memory 430 and read data retrieved from flash memory 430. The data stored in buffer memory 421 is transferred to flash memory 430 or host 410 under the control of memory controller 420.

Backup memory 422 is used to store LSB data when an MSB program failure occurs. As noted above, when the MSB data is written to flash memory 430 following program of corresponding LSB data, the LSB data may be damaged. However, memory system 400 may repair the lost LSB data, and backup memory 422 is used to store the repaired LSB data.

Here again, buffer memory 421 and backup memory 422 may be implemented in a single memory or memory subsystem. For example, buffer memory 421 and backup memory 422 may be integrated into one RAM.

ECC circuit 423 is used to (first order) correct a predetermined bit error. For example, a 4-bit/512-byte ECC circuit can correct 4 bit errors per 512 bytes of data. In this case, damaged data may be corrected when an error occurs in four or less bits of 512 bytes.

ECC circuit 423 may be used to correct damaged LSB data when an MSB program failure occurs. However, under the foregoing assumption regarding ECC capabilities, an error in more than four bits of LSB data is uncorrectable by ECC circuit 423. However, such uncorrectable LSB data may yet be (second order) repaired by embodiments of the invention, such as memory system 400 shown in FIG. 5.

When an MSB program failure occurs, comparator 424 is used to compare "MSB read data" (i.e., MSB data read from flash memory 430 following the MSB program operation) with the MSB buffer data (i.e., MSB data stored in buffer memory 421). Comparator 424 compares MSB read data with the MSB buffer data and provides a comparison result to fail position detector 425.

Fail position detector 425 receives the comparison result from comparator 424 and detects the bit position(s) of the detected bit errors to generate fail position information. Fail position detector 425 stores the address of memory cells in flash memory 430 associated with the fail position information and provides the fail position information to repair circuit 426.

Repair circuit 426 repairs the LSB data corresponding to the fail position information. The LSB data damaged during the MSB program failure is stored in backup memory 422. At this point in the illustration, it is assumed that the damaged LSB data includes data that can not be corrected by ECC circuit 423. The operational relationships between comparator 424, fail position detector 425, and repair circuit 426 will be described in some additional detail with reference to FIGS. 6 and 7.

However, returning to FIG. 5, flash memory 430 includes a cell array 431, a decoder 432, a page buffer 433, a bitline selection circuit 434, a data buffer 435, and a control unit 436. The structure and operation of flash memory 430 are similar to that of flash memory 230 illustrated in FIG. 3.

In FIG. 5, a page 0 sharing a wordline WL0 is indicated by a dashed line. A predetermined cell (indicated in black) of the page 0 denotes a flag cell. The flag cell is used to indicate whether or not the LSB and/or the MSB of the page 0 have been programmed.

When a MSB program failure occurs, memory system 400 compares MSB read data with MSB buffer data to determine a failure position, and repairs the LSB data associated with the failure position. Only when a MSB program failure occurs, does memory system 400 backup the LSB data and repair the damaged LSB data. Thus, memory system 400 does not always backup the LSB data before the MSB program operation. This adaptation over the foregoing embodiments, significantly reduces the overall programming time, as compared with embodiments such as those shown in memory systems 200 and 300. In addition, memory system 400 can completely repair the damaged LSB data using a combination of the capabilities provided by the ECC circuit and the capabilities of the MSB comparison operation. This ability improves reliability of the data stored in flash memory 430.

A memory block identified as including a memory cell associated with a program failure is treated as a bad block, and the LSB data stored in backup memory 422 is programmed to another memory block. Thereafter, the corresponding MSB data stored in buffer memory 421 is programmed to another memory block. This approach to re-programming of write data in its LSB and MSB components is similar to the re-programming operation described in relation to the embodiments shown in FIGS. 3 and 4.

Figure 6:
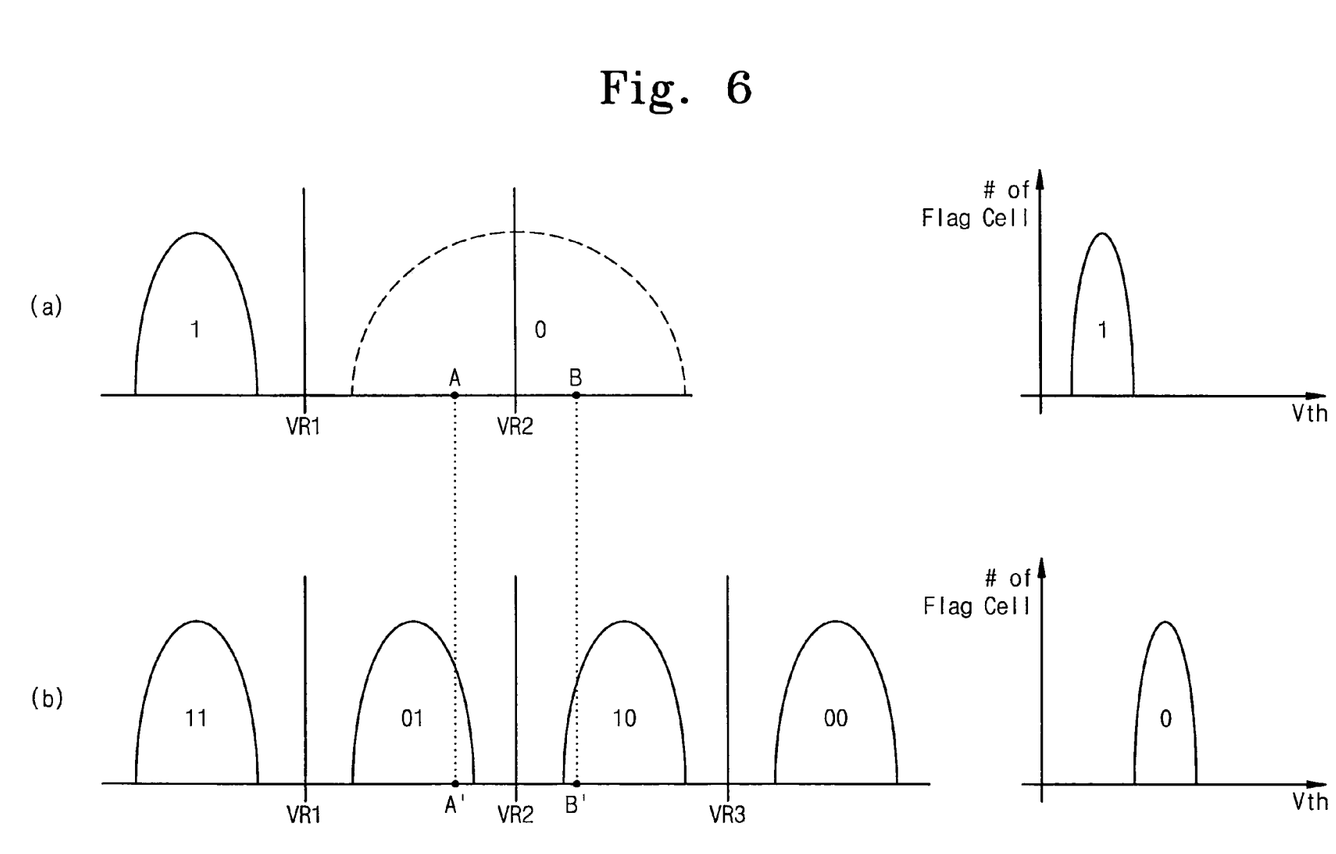
FIG. 6 is a diagram illustrating a multi-bit program operation of the memory system illustrated in FIG. 5.

FIG. 6 is a voltage distribution diagram further illustrating the multi-bit program operation of the memory system illustrated in FIG. 5. FIG. 6(a) illustrates the LSB program operation, and FIG. 6(b) illustrates the MSB program operation. The state of the flag cell associated with the LSB/MSB program operations is illustrated in relation to FIGS. 6(a) and 6(b). In FIG. 6, the axis of abscissas represents the threshold voltages of memory cells and the axis of ordinates represents the dispersion of the memory cells. Reference symbols VR1, VR2 and VR3 denote discrimination voltages used to determine the voltage level of individual memory cells.

Referring to FIG. 6(a), a memory cell with a threshold voltage lower than VR1 stores an LSB "1", and a memory cell with a threshold voltage higher than VR1 stores an LSB "0". The LSB "1" indicates an erase state, and the LSB "0" indicates a program state.

Information indicating the program state for the LSB is stored in the flag cell illustrated in FIG. 5. When the flag cell stores a "1", as illustrated in FIG. 6(a), the programming of the LSB to page 0 is indicated. On the other hand, when the flag cell stores a "0", as illustrated in FIG. 6(b), the programming of both LSB and MSB to page 0 is indicated.

When the MSB program operation is performed normally, a memory cell with an LSB value of "1" will be stored as "11" or "01" according to its MSB. A memory cell with the LSB value of "0" will be stored as "10" or "00" according to its MSB. However, in the program method illustrated in FIG. 6, there may arise cases wherein the LSB undergoes a change during a MSB program failure.

A description will now be given for a case where a MSB value of "0" is programmed to a memory cell having previously been programmed with a LSB value of "1". It is first assumed that the MSB program operation is successfully preformed and that the MLC thereafter stores a 2-bit data value of "01". Next, however, it is assumed that a MSB program failure occurs, and that the MLC stores a data value of "11", instead of the intended value of "01'. In this second assumed case, the LSB does not change as a result of the MBS program failure.

Next, a description will be given for a case where a MSB value of "1" or "0" is programmed to a memory cell previously programmed with a LSB value of "0". The threshold voltage distribution for this memory cell state is shown in FIG. 6(a) and corresponds to the threshold voltage distribution of a memory cell having a state "01" or "10" in FIG. 6(b).

For example, a memory cell with a threshold voltage A in FIG. 6(a) corresponds to a memory cell with a threshold voltage A' in FIG. 6(b). The memory cell with the threshold voltage A' stores data "01". Likewise, a memory cell with a threshold voltage B in FIG. 6(a) corresponds to a memory cell with a threshold voltage B' in FIG. 6(b). The memory cell with the threshold voltage B' stores data "10".

When a MSB value of "1" is successfully programmed to a memory cell having a LSB value of "0", the memory cell stores data "10". Likewise, when a MSB value of "0" is successfully programmed to a memory cell having a LSB value of "0", the memory cell stores data "00".

When a MSB value of "1" is programmed, that is, when data "10" is programmed, the threshold voltage of the memory cell having a LSB value of "0' need only to move slightly upward. However, a programming error may occur during the programming of the MSB to a value of "1". Such errors may have many causes, such as a defective memory cell, etc.

In this case, the memory cell having the threshold voltage A fails to be programmed to a state of "10", but maintains its state of "01". In this case, the LSB value is changed from "0" to "1". That is, the LSB previously programmed to a value of "0" is changed to a value of "1" during the MSB program operation.

When a program error occurs, the memory cell with a threshold voltage B fails to be programmed to a state of "00" but maintains a state of "10". In this case, the LSB value of "0" is retained. That is, even when an MSB program error occurs, the memory cell having a threshold voltage B does not lose its proper LSB value.

As described above, the LSB in memory system 400 may be changed due to a MSB programming failure. That is, a memory cell having threshold voltage A in FIG. 6 may move to a threshold voltage A' due to the MSB program failure. In this case, the LSB changes from "0' to "1". In the other cases, even when an MSB program failure occurs, the LSB does not change. A description will now be given of a method for programming a memory system in view of the foregoing.

Figure 7:
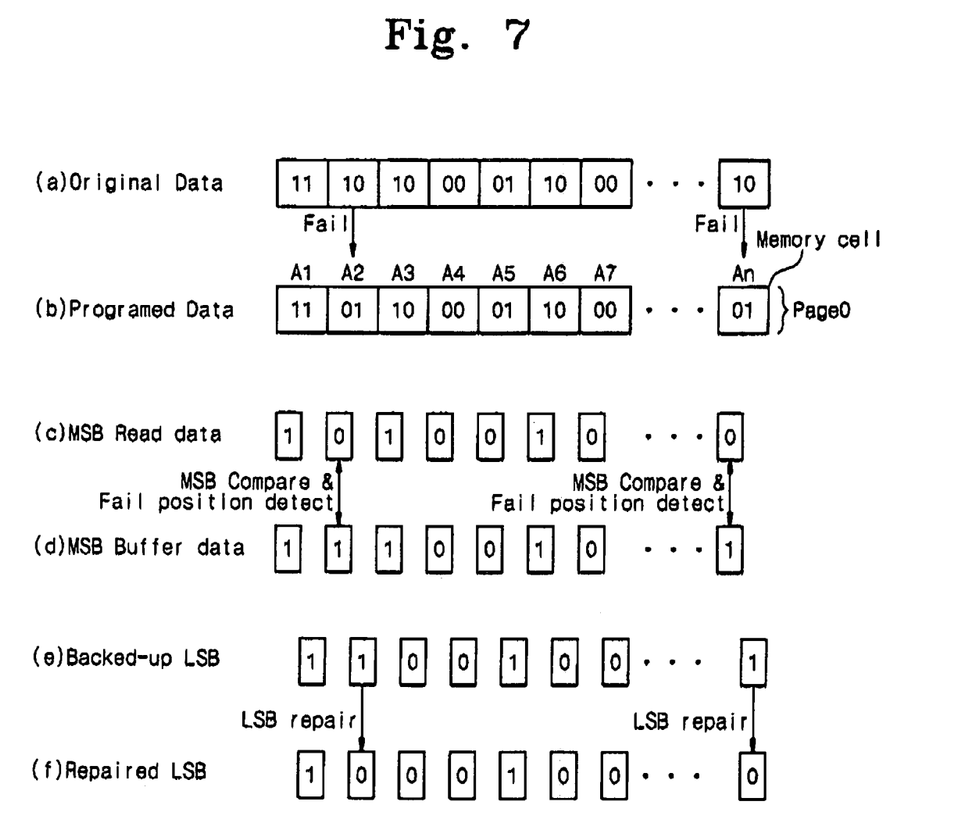
FIG. 7 is an exemplary diagram illustrating an error position detecting operation and an LSB repairing operation of the memory system illustrated in FIG. 5.

FIG. 7 is a conceptual diagram illustrating the error position detecting operation and the LSB repair operation of the memory system illustrated in FIG. 5. FIG. 7(a) shows original data to be programmed, and FIG. 7(b) illustrates the actual (errant) data programmed to a selected page (i.e., page 0).

In FIG. 7(b), A1, A2, . . . , are address values indicating address positions for the respective memory cells in the selected page. As illustrated in FIGS. 7(a) and 7(b), it is assumed that a program failure occurs at memory cells having addresses A2 and An. That is, failure positions are identified by A2 and An. Due to this program failure, a 2-bit data of "01" is programmed to these memory cells instead of the intended data value of "10".

FIGS. 7(c) and 7(d) further illustrate the operation of comparator 424 and fail position detector 425. FIG. 7(c) shows MSB read data from flash memory 430, and FIG. 7(d) shows MSB buffer data stored in buffer memory 421. Comparator 424 compares the MSB read data with the MSB buffer data on a bit-by-bit basis. Fail position detector 425 detects fail positions (e.g., A2 and An) in relation to the comparison result.

FIG. 7(e) shows LSB backup data stored in backup memory 422, and FIG. 7(f) shows repaired LSB data. Repair circuit 426 receives fail positions A2 and An from fail position detector 425 and changes LSB data at the fail positions A2 and An from "1" to "0". As a result, the damaged LSB data is repaired. In addition, because MSB data is stored in buffer memory 421, all of the multi-bit data associated with the program failure may be repaired.

Referring back to FIG. 5, only when an MSB program failure occurs does memory system 400 backup LSB data and repair damaged LSB data. Accordingly, memory system 400 need not always backup the LSB data before a corresponding MSB program operation. Thus, in the aggregate the time required for program operations may be greatly reduces. In addition, memory system 400 may completely repair damaged LSB data using the combined capabilities of the ECC circuit and the MSB comparison operation, thus providing improved data reliability.

Figure 8:
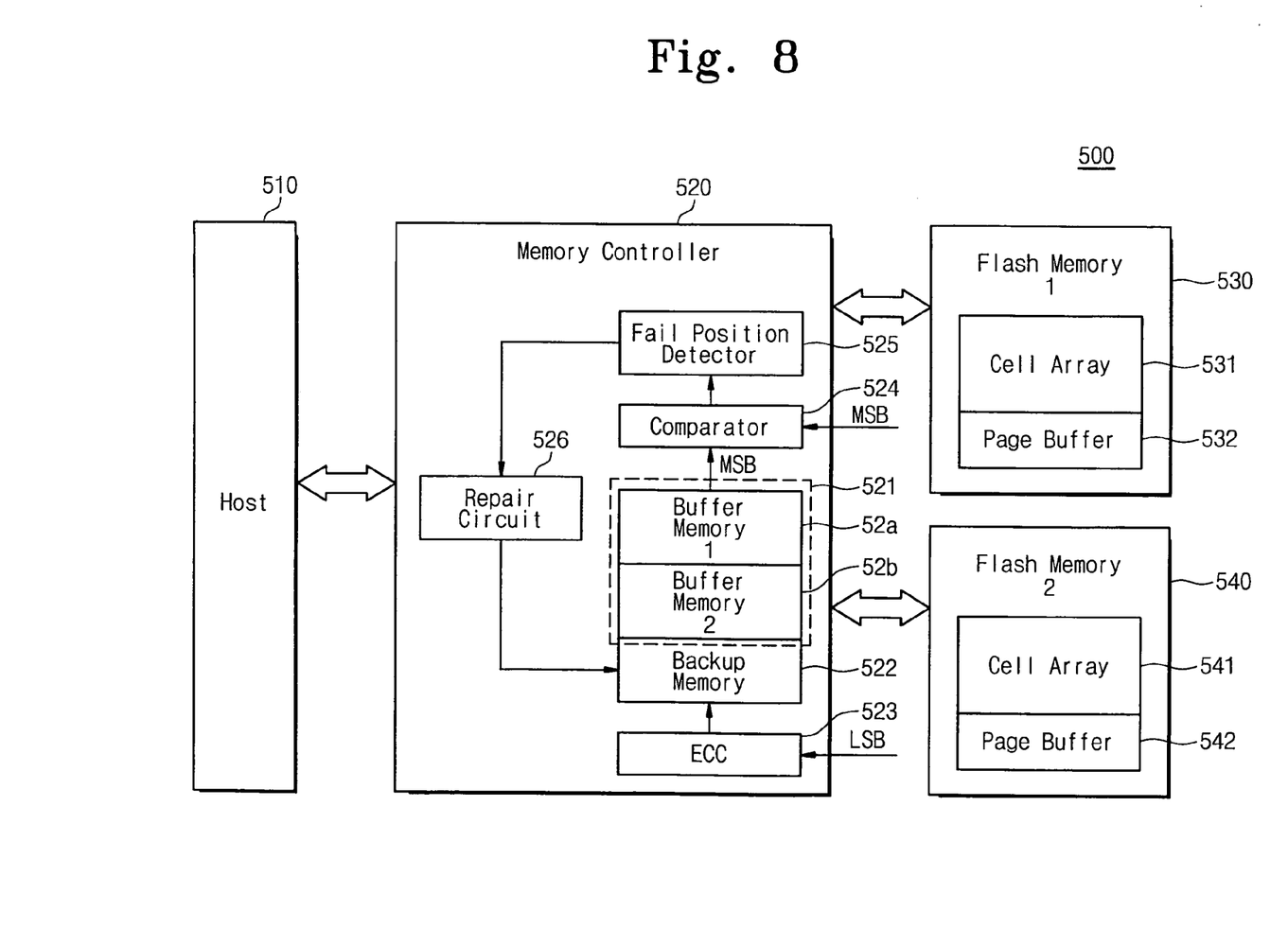
FIG. 8 is a block diagram of a memory system according to a fourth embodiment of the present invention.

FIG. 8 is a block diagram of a memory system according to another embodiment of the present invention. In FIG. 8, a memory system 500 includes a host 510, a memory controller 520, a first flash memory 530, and a second flash memory 540.

Memory controller 520 receives one or more command(s) from host 510 and in response controls the overall operation of first and second flash memories 530 and 540. Memory controller 520 includes a buffer memory 521, a backup memory 522, an ECC circuit 523, a comparator 524, a fail position detector 525, and a repair circuit 526. Buffer memory 521 includes a first buffer memory 52a and a second buffer memory 52b. First buffer memory 52a is used for write/read operations associated with first flash memory 530. Second buffer memory 52b is used for write/read operations associated with second flash memory 540.

Backup memory 522 is used to backup LSB data when a failure occurs during programming of MSB data to first and second flash memories 530 and 540 having previously programmed LSB data. Memory system 300 of FIG. 4 includes two backup memories (i.e., first and second LSB backup memories 322 and 324), whereas, memory system 500 in FIG. 8 includes only a single backup memory (i.e., backup memory 522).

Memory system 300 of FIG. 4 always backups the LSB data before each MSB program operation and thus requires an LSB backup memory associated with each flash memory. However, memory system 500 of FIG. 8 backups LSB data only when a MSB program failure occurs, and thus requires only a single backup memory because of the very low probability of simultaneous program failures occurring in both first and second flash memories 530 and 540.

According to memory system 500 in FIG. 8, it is possible to reduce the number of backup memories while yet completely repairing LSB data otherwise lost due to a program failure.

As described above, memory systems according to embodiments of the invention include backup memory/memories associated with a memory controller so as to prevent the loss LSB data during a corresponding (and following) MSB program operation. However, the backup memory/memories storing the LSB data might alternately or additionally be associated with flash memory. A description will now be given of a memory system including a memory backing up LSB data in a flash memory.

Figure 9:
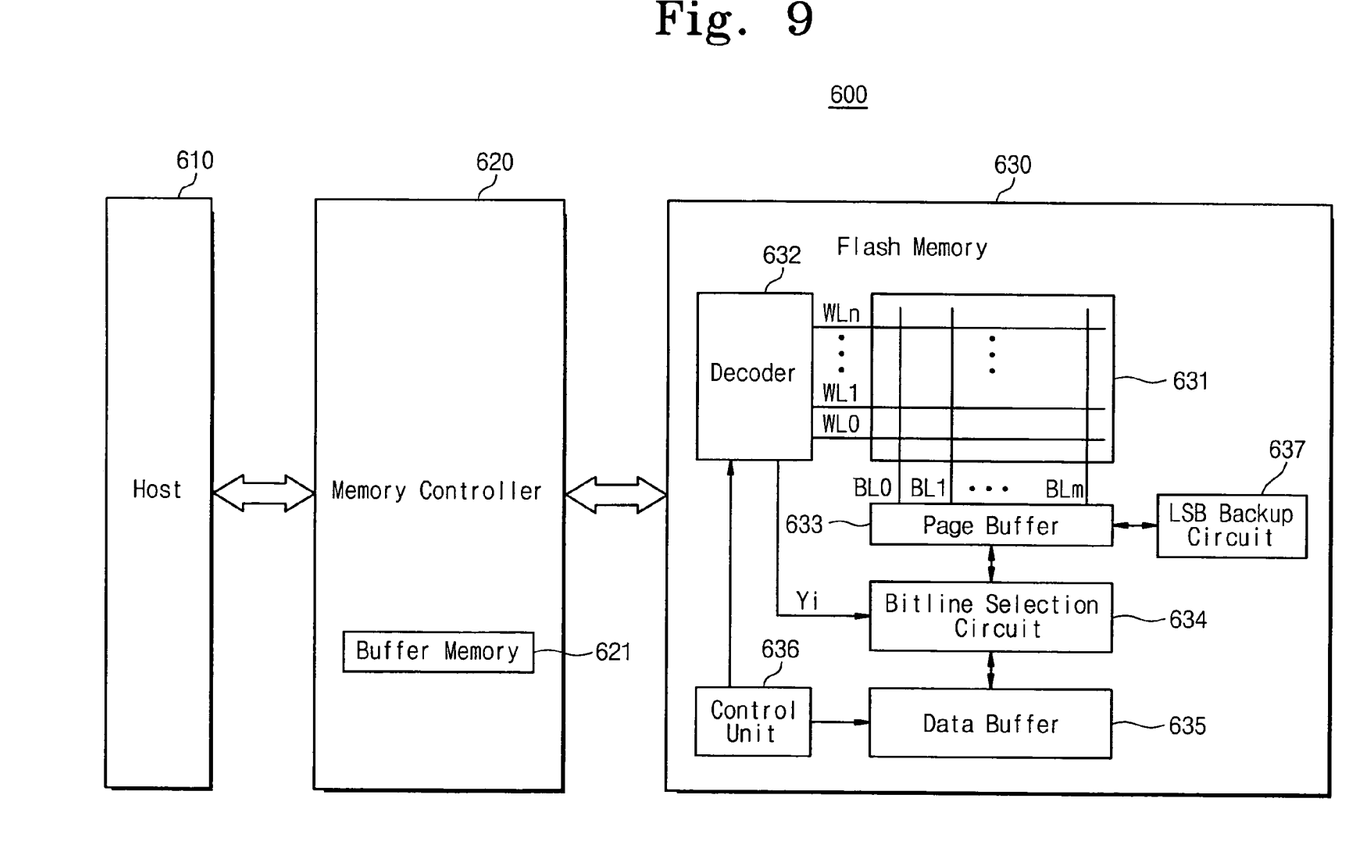
FIG. 9 is a block diagram of a memory system according to a fifth embodiment of the present invention.

FIG. 9 is a block diagram of a memory system according to another embodiment of the invention.

Referring to FIG. 9, a memory system 600 includes a host 610, a memory controller 620, and a flash memory 630. As before, memory controller 620 and flash memory 630 may be included on a memory card.

Memory controller 620 receives data and a write command from host 610 and controls flash memory 630 to write data to a cell array 631. Also, in response to the received write command, memory controller 620 controls flash memory 630 so that the data stored in cell array 631 is read.

Buffer memory 621 temporarily stores read and write data. Under the control of memory controller 620, buffer memory 621 transfers the temporarily-stored data to host 610 or flash memory 630.

Flash memory 630 includes cell array 631, a decoder 632, a page buffer 633, a bitline selection circuit 634, a data buffer 635, a control unit 636, and an LSB backup circuit 637. Except for LSB backup circuit 637, the structure and operation of flash memory 630 are the same as those described in relation to memory system 200 of FIG. 3.

However, unlike memory system 200 of FIG. 3, memory system 600 includes LSB backup circuit 637 associated with flash memory 630. LSB backup circuit 637 is used to program multi-bit data to flash memory 630. In the illustrated example, LSB backup circuit 637 is connected to page buffer 633. LSB backup circuit 637 receives LSB data through page buffer 633 and stores the received LSB data.

As before, the LSB data is first written to flash memory 630 before the MSB data is written, and the possibility of damaging the LSB data arises. In order to prevent loss of the LSB data, LSB backup circuit 637 is used to backup the LSB data written to flash memory 630, before the MSB write operation. In one embodiment, LSB backup circuit 637 stores one page of LSB data.

Figure 10:
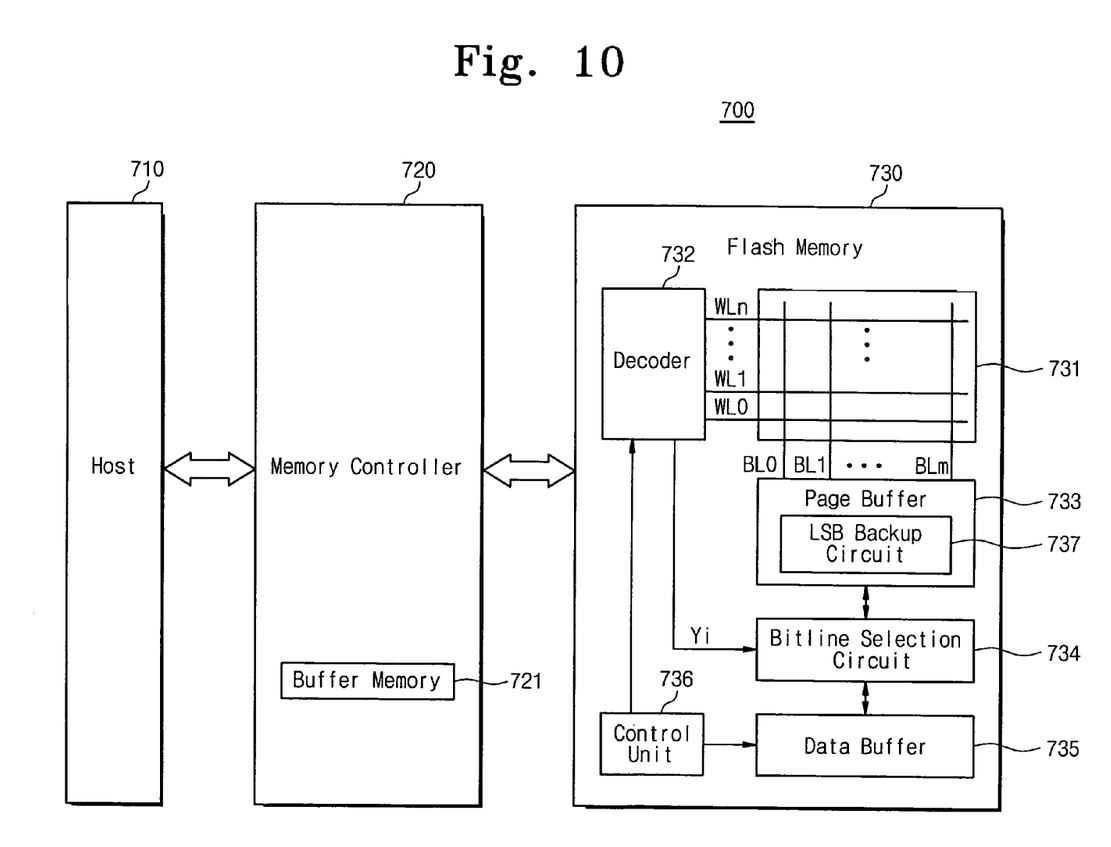
FIG. 10 is a block diagram of a memory system according to a sixth embodiment of the present invention.

FIG. 10 is a block diagram of a memory system according to another embodiment of the invention. Referring to FIG. 10, a memory system 700 includes a host 710, a memory controller 720, and a flash memory 730. Memory controller 720 and flash memory 730 may be implemented on a memory card.

Except for the configuration of page buffer 733, the structure and operation of memory system 700 is similar to that of memory system 600 shown in FIG. 9.

Page buffer 733 stores data loaded from buffer memory 721. A page of data may be loaded into page buffer 733, and then the loaded data may be collectively programmed to a selected page during a program operation. In a read operation, page buffer 733 reads data from a selected page and stores the resulting read data temporarily. In response to a read enable signal nRE (not illustrated), the data stored in page buffer 733 is transferred to buffer memory 721.

Page buffer 733 includes an LSB backup circuit 737 adapted to the process of backing up LSB data. LSB backup circuit 737 is used to backup LSB data before an MSB write operation in order to prevent loss of the LSB data during the MSB program operation.

Figure 11:
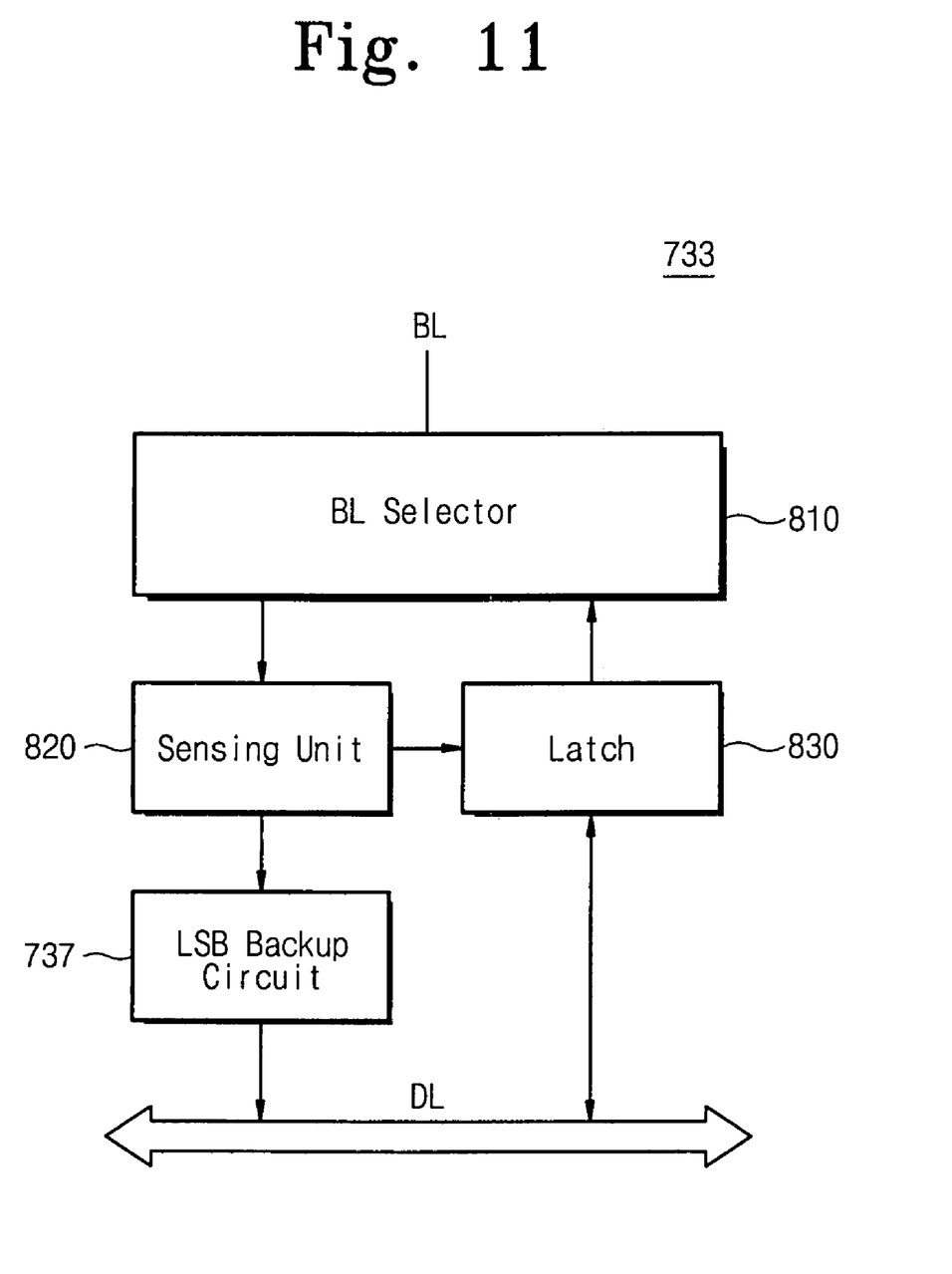
FIG. 11 is an exemplary block diagram of a page buffer illustrated in FIG. 10.

FIG. 11 is a block diagram of one possible implementation of page buffer 737 illustrated in FIG. 10.

Referring to FIG. 11, page buffer 737 includes a bitline selector 810, a sensing unit 820, a latch 830, and an LSB backup circuit 737.

During a read/write operation, bitline selector 810 selects a cell connected to a predetermined bitline BL according to the output of a bitline selection circuit 734. (See, FIG. 10). Sensing unit 820 is used to read the data stored in the cell selected by bitline selector 810.

Latch 830 stores data loaded into a data buffer 735 (see FIG. 10) through a data line DL. Thereafter, the data stored in latch 830 is programmed into the memory cell selected by a bitline during a program operation. If the latched data is "1", the program operation is inhibited, but if the latched data is "0", it is programmed to a memory cell.

In a read operation, latch 830 temporarily stores data that is sensed by sensing unit 820 from the memory cell selected by bitline selector 810. In response to a read enable signal, latch 830 transfers the stored data to data buffer 735.

Before a MSB write operation, LSB backup circuit 737 backups the LSB data previously written to memory cell array 731. (See, FIG. 10). The data stored in latch 830 is changed during a program verifying operation. However, the LSB data stored in LSB backup circuit 737 is not changed during the program verifying operation.

Operation of page buffer 733 will now be described with the assumption that LSB data has already been written to cell array 731.

Before a MSB write operation, bitline selector 810 is used to select the memory cell to which the MSB data will be written. Sensing unit 820 reads the LSB from the selected memory cell and stores the read LSB data in LSB backup circuit 737.

Thereafter, the MSB loaded from data buffer 735 is stored in latch 830. The MSB stored in latch 839 is programmed to the selected memory cell. If the MSB is programmed normally, the LSB data stored in LSB backup circuit 737 is erased. However, if a MSB program failure occurs, the LSB data stored in LSB backup circuit 737 is written to another memory block and then the MSB stored in latch 803 is written.

As described above, various memory systems according to embodiment of the invention include one or more LSB backup memories associated with a flash memory. These arrangements prevent the loss of LSB data due to a subsequent MSB program failure.

The above-disclosed subject matter is to be considered illustrative, and not restrictive, and the appended claims are intended to cover all such modifications, enhancements, and other embodiments, which fall within the scope of the present invention as defined by the flowing claims.

What is claimed is:

1. A memory system comprising:
    a flash memory sequentially storing first bit data and second bit data; and
    a memory controller including a buffer memory temporarily storing the first bit data and the second bit data, and a backup memory storing the first bit data to prevent loss of the first bit data in the event of a failure of the programming of the second bit data.

2. The memory system of claim 1, wherein the first bit data is stored in the backup memory before storing the second bit data.

3. The memory system of claim 2, wherein the memory controller re-programs the first bit data stored in the backup memory to a different memory block within the flash memory.

4. The memory system of claim 1, wherein the backup memory comprises a latch.

5. The memory system of claim 1, wherein the flash memory includes a page buffer temporarily storing data loaded from the buffer memory.

6. A memory system comprising:
    a host communicating original data and a command;
    a flash memory comprising a page buffer and configured to sequentially store first bit data and second bit data of the original data in an array of multi-level memory cells; and
    a memory controller responsive to the command and comprising:
        a buffer memory temporarily storing the first bit data and the second bit data and transferring the first bit data and the second bit data to and from the page buffer;
        a comparator comparing the second bit data actually stored in the flash memory with second bit data stored in the buffer memory after storing the second bit data, and generating a comparison result;
        a fail position detector responsive to the comparison result and generating fail position information;
        an ECC circuit performing first order repair on errant first bit data in relation to a failure of the programming of the second bit data;
        a repair circuit performing second order repair on the errant first bit data in relation to the fail position information in response to the failure of the programming of the second bit data; and
        a backup memory storing a repaired errant first bit data.

7. The memory system of claim 6, wherein the backup memory is operatively configured in common circuitry with the buffer memory within the memory controller.

8. The memory system of claim 7, wherein the backup memory and the buffer memory are implemented in a single RAM.

9. The memory system of claim 6, wherein the backup memory is operatively configured with the page buffer within the flash memory.

10. The memory system of claim 9, wherein the backup memory and the page buffer are configured from separate and electrically connected circuit within the flash memory.

11. A program method for a memory system including a flash memory storing first and second bit data in a memory cell array and further comprising a backup memory separate from the memory cell array, and a related memory controller comprising a buffer memory temporarily storing the first and second bit data, the method comprising:
    programming the first bit data in the memory cell array of the flash memory;
    storing the first bit data in the backup memory before programming the second bit data in the memory cell array of the flash memory; and
    in response to a failure of programming for the second bit data, programming the second bit data in the flash memory.

12. The program method of claim 11, further comprising:
    in response to the failure of programming for the second bit data, re-programming the first bit data in the memory cell array of the flash memory using the first bit data read from the backup memory.

13. The program method of claim 12, wherein the backup circuit comprises a latch.

14. The program of claim 11, further comprising:
    in response to the failure of programming for the second bit data, re-programming the second bit data in the memory cell array of the flash memory using the second bit data read from the buffer memory.

15. A program method for a memory system including a flash memory comprising a memory cell array storing first and second bit data, a memory controller including a buffer memory temporarily storing the first and second bit data, and a backup memory implemented in circuitry separate from the memory cell array, the method comprising:
    transferring the first and second bit data to the buffer memory in the memory controller;
    programming the first bit data in the memory cell array of the flash memory;
    storing the first bit data in the backup memory;
    programming the second bit data in the memory cell array of the flash memory;
and then,
    comparing the second bit data read from the memory cell array of the flash memory with the second bit data stored in the buffer memory; and
    upon determining a comparison failure between the second bit data read from the flash memory with the second bit data stored in the buffer memory, correcting the first bit data stored in the backup memory of the flash memory using an error correction coding scheme.

16. The program method of claim 15, wherein backup memory is operatively configured in circuitry common with the buffer memory in the memory controller.

17. The program method of claim 15, wherein backup memory is operatively configured with page buffer within the flash memory.

18. The program method of claim 15, wherein the backup circuit comprises a latch.

* * * * *